United States Patent
Hoshika

(10) Patent No.: US 7,229,852 B2
(45) Date of Patent: *Jun. 12, 2007

(54) MANUFACTURING METHOD OF SEMICONDUCTOR WAFER HAVING LID PART AND MANUFACTURING METHOD OF SEMICONDUCTOR DEVICE

(75) Inventor: Masato Hoshika, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 97 days.

This patent is subject to a terminal disclaimer.

(21) Appl. No.: 11/152,950

(22) Filed: Jun. 15, 2005

(65) Prior Publication Data

US 2005/0277268 A1    Dec. 15, 2005

(30) Foreign Application Priority Data

Jun. 15, 2004    (JP) .............................. 2004-177529

(51) Int. Cl.
    H01L 21/44    (2006.01)
(52) U.S. Cl. ...................... 438/118; 438/125; 257/704; 257/E21.5
(58) Field of Classification Search ................ 438/118, 438/121, 378, 125; 257/704, 710, 924; 313/512, 313/24, 25
    See application file for complete search history.

(56) References Cited

U.S. PATENT DOCUMENTS

2004/0232833 A1*  11/2004  Menda et al. ................ 313/512
2006/0043544 A1*  3/2006  Tsukamoto et al. ......... 257/666

FOREIGN PATENT DOCUMENTS

JP    2001-257334    9/2001
JP    2004-296453    10/2004

* cited by examiner

Primary Examiner—Quoc Hoang
(74) Attorney, Agent, or Firm—David G. Conlin; David A. Tucker; Edwards Angell Palmer & Dodge LLP

(57) ABSTRACT

An adhesive layer containing a photo-curing adhesive and a thermosetting adhesive is formed on a semiconductor wafer in which a plurality of semiconductor elements are formed. The adhesive layer and the semiconductor wafer are adhered together by selectively exposing the adhesive layer to light and curing the photo-curing adhesive contained in the adhesive layer on the peripheral portion of each semiconductor element. By developing the photo-curing adhesive, the adhesive layer in an area that has not been exposed is removed. Whether the pattern of the adhesive layer is satisfactory or not is determined for each semiconductor element. A lid part is placed on the adhesive layer of the semiconductor element determined to be satisfactory, and the adhesive layer and the lid part are adhered together by heating the adhesive layer and causing the thermosetting adhesive contained in the adhesive layer to exhibit adhesive properties.

17 Claims, 11 Drawing Sheets

MANUFACTURING METHOD OF SEMICONDUCTOR WAFER HAVING LID PART AND MANUFACTURING METHOD OF SEMICONDUCTOR DEVICE

CROSS-REFERENCE TO RELATED APPLICATION

This non-provisional application claims priority under 35 U.S.C. §119(a) on Patent Application No. 2004-177529 filed in Japan on Jun. 15, 2004, the entire contents of which are hereby incorporated by reference.

BACKGROUND OF THE INVENTION

The present invention relates to a manufacturing method of semiconductor wafer having a lid part on each of a plurality of semiconductor elements formed in the semiconductor wafer, and a manufacturing method of semiconductor device using this manufacturing method of semiconductor wafer.

Solid-state image pickup devices, such as CCDs and CMOS imagers, that are one kind of semiconductor devices have been practically used in a variety of fields. A solid-state image pickup device is composed of a circuit including a light receiving section such as a photodiode, and a reading section for reading electric signals based on the output of the light receiving section. Such a solid-state image pickup device is manufactured by stacking a plurality of layers on a semiconductor wafer by using a known technique.

By the way, in recent years, there has been a demand for high-density, high-resolution and small-size solid-state image pickup devices, and the pitch size per pixel shows a tendency to decrease. In order to satisfy such a demand, the area of the light receiving section (hereinafter referred to as the light receiving area) must be reduced. When the light receiving area is reduced, the amount of received light decreases and the dynamic range decreases, and therefore it is necessary to compensate for the decrease in the amount of received light by arranging micro-lenses on the light receiving section.

In general, on the surface of a semiconductor chip on which a functional element is formed as a solid-state image pickup device, micro-lenses are formed by processing a translucent resin into the form of on-chip lenses. Therefore, the micro-lenses cause unevenness in the surface of the solid-state image pickup device. The light receiving surface of the solid-state image pickup device is very important as a sensor, and if foreign matter adheres, the lightness and chromaticity change due to the foreign matter and the reproducibility of the captured image deteriorates, and there is also a possibility that the light receiving surface may be scratched. Thus, since the quality and reliability of the solid-state image pickup device deteriorate if foreign matter adheres, the light receiving surface of the solid-state image pickup device is protected by a translucent lid part made of glass, etc.

As described above, the solid-state image pickup device has a structure in which the light receiving surface is protected by the lid part. In particular, in a solid-state image pickup device having on-chip micro-lenses, the unevenness of the surface is extremely complicated. Therefore, after mounting the semiconductor chip in a package case made of ceramic, plastic, etc., the light receiving surface is covered with the lid part to protect the solid-state image pickup device in the package case and prevent entry of foreign matter from outside. However, since there is a limitation in decreasing the size of a solid-state image pickup device of the package structure, a structure shown in FIG. 1 is proposed. In this structure, a glass plate 106 is joined to the surface of a semiconductor chip 101 on which solid-state image pickup elements are formed through an epoxy-based resin sheet 104 having a perforated portion 103 formed only at the light receiving section 102 with an adhesive 105 (see, for example, Japanese Patent Application Laid-Open No. 2001-257334). Thus, by directly joining the glass plate 106 (lid part) to the semiconductor chip 101, it is possible to decrease the size of the solid-state image pickup device compared with the package structure.

However, in the above-described manufacturing method of solid-state image pickup device, the epoxy-based resin sheet 104 is used to ensure the spacing between the glass plate 106 and the semiconductor chip 101, and the glass plate 106 and the semiconductor chip 101 are adhered to both surfaces of the epoxy-based resin sheet 104 using the adhesive 105. Since the epoxy-based resin sheet 104 has a hole formed so that it is not positioned over the light receiving section 102, the tension applied to the sheet is uneven due to the influence of the hole. Consequently, the epoxy-based resin sheet 104 becomes very unstable in shape when attaching it, and there is a problem that the attaching step becomes extremely difficult. Moreover, when adhering the epoxy-based resin sheet 104 to the surface of the semiconductor chip 101, it takes a time for positioning the epoxy-based resin sheet 104 and the semiconductor chip 101, and there is also a problem that the management of the manufacturing steps is complicated because sufficient measures are not taken to prevent contamination of the light receiving surface on which the micro-lenses are arranged.

Further, in the epoxy-based resin sheet 104, since the perforated portion 103 is formed by producing a hole, there is a limitation in decreasing the size of the perforated portion 103. Since the size of the closed space of the solid-state image pickup device is determined by the perforated portion 103, there is a limitation in decreasing the size of the structure of the solid-state image pickup device even if the method disclosed in the Japanese Patent Application Laid-Open No. 2001-257334 is used.

BRIEF SUMMARY OF THE INVENTION

The present invention has been made with the aim of solving the above problems, and it is an object of the present invention to provide a manufacturing method of semiconductor wafer having a lid part and a manufacturing method of semiconductor device, which are capable of reducing external influences (such as moisture and dust) by creating a space by forming a material obtained by suitably mixing a photo-curing adhesive (photosensitive adhesive) and a thermosetting adhesive on a semiconductor wafer as a material of an adhesive layer for joining the semiconductor wafer in which a plurality of semiconductor elements are formed and a lid part together, patterning the adhesive layer into a predetermined form by using the characteristic of the photo-curing adhesive contained in the adhesive layer, heating the patterned adhesive layer after placing the lid part, and joining the semiconductor wafer and the lid part together through the adhesive layer by using the characteristic of the thermosetting adhesive contained in the adhesive layer, and also capable of achieving a reduction in the size of a semiconductor device and realizing high-quality and reliable chip-size semiconductor device.

Another object of the present invention is to provide a manufacturing method of semiconductor wafer having a lid part and a manufacturing method of semiconductor device, which are capable of achieving high manufacturing efficiency by determining whether the patterned adhesive layer is satisfactory or not for each semiconductor element after patterning the adhesive layer and by not placing the lid part on the adhesive layer determined to be unsatisfactory.

Still another object of the present invention is to provide a manufacturing method of semiconductor wafer having a lid part and a manufacturing method of semiconductor device, which are capable of achieving high manufacturing yield by determining whether the patterned adhesive layer is satisfactory or not for each semiconductor element after patterning the adhesive layer and by repairing the adhesive layer having a defective portion and determined to be unsatisfactory.

Still another object of the present invention is to provide a manufacturing method of semiconductor wafer having a lid part and a manufacturing method of semiconductor device, which are capable of forming the adhesive layer on the semiconductor wafer by a very simple method and at low cost by adhering an adhesive sheet containing a photo-curing adhesive and a thermosetting adhesive to the semiconductor wafer in which a plurality of semiconductor elements are formed.

Still another object of the present invention is to provide a manufacturing method of semiconductor wafer having a lid part and a manufacturing method of semiconductor device, which are capable of supplying the adhesive sheet by a very simple method and effectively by attaching protective films to both sides of the adhesive sheet and adhering the adhesive on the semiconductor wafer by separating the protective film on the side facing the semiconductor wafer, and capable of reducing the costs required for a manufacturing machine.

Still another object of the present invention is to provide a manufacturing method of semiconductor wafer having a lid part and a manufacturing method of semiconductor device, which are capable of ensuring smoothness until patterning and capable of preventing adhesion of dust to the surface of the adhesive layer in the manufacturing process by separating the other protective film after patterning the adhesive layer into a predetermined form by using the characteristic of the photo-curing adhesive contained in the adhesive layer.

Still another object of the present invention is to provide a manufacturing method of semiconductor wafer having a lid part and a manufacturing method of semiconductor device, which are capable of adhering the lid part to the adhesive layer of each semiconductor element by using a lid part having a plane size smaller than the plane size of each semiconductor device, and capable of achieving high manufacturing efficiency by not placing the lid part on the adhesive layer of the semiconductor element determined to be unsatisfactory.

Still another object of the present invention is to provide a manufacturing method of semiconductor wafer having a lid part and a manufacturing method of semiconductor device, which are capable of significantly reducing the manufacturing time by using a lid part having a plane size capable of covering a plurality of semiconductor devices, and adhering the lid part to the plurality of semiconductor elements collectively.

Still another object of the present invention is to provide a manufacturing method of semiconductor device, which is capable of preventing adhesion of dust and scratches on the surface of semiconductor element after the dividing step by cutting and dividing the semiconductor wafer into individual semiconductor elements having a lid part adhered thereto.

A manufacturing method of semiconductor wafer having a lid part of the present invention comprises: an adhesive layer forming step for forming an adhesive layer containing a photo-curing adhesive and a thermosetting adhesive on a semiconductor wafer in which a plurality of semiconductor elements are formed; a first adhering step for adhering the adhesive layer and the semiconductor wafer together by selectively exposing the adhesive layer to light and curing the photo-curing adhesive contained in the adhesive layer on a peripheral portion of each semiconductor element; a development step for patterning the adhesive layer by developing the adhesive layer and removing the adhesive layer in an area where the photo-curing adhesive has not cured; an inspection step for inspecting each semiconductor element to determine whether the patterned adhesive layer is satisfactory or not; a lid part placing step for placing a lid part on the adhesive layer of the semiconductor element determined to be satisfactory in the inspection step; and a second adhering step for adhering the adhesive layer and the lid part together by heating the adhesive layer and causing the thermosetting adhesive contained in the adhesive layer to exhibit adhesive properties.

According to the present invention, an adhesive layer containing a photo-curing adhesive and a thermosetting adhesive is formed on a semiconductor wafer in which a plurality of semiconductor elements are formed, and the adhesive layer and the semiconductor wafer are adhered together by selectively exposing the adhesive layer to light and curing the photo-curing adhesive contained in the adhesive layer on the peripheral portion of each semiconductor element. Then, after developing the photo-curing adhesive and removing the adhesive layer in the area that has not been exposed, a determination is made for each semiconductor element as to whether the patterned adhesive layer is satisfactory or not. Then, after placing a lid part on the adhesive layer of the semiconductor element determined to be satisfactory, the adhesive layer and the lid part are adhered together by heating the adhesive layer and causing the thermosetting adhesive contained in the adhesive layer to exhibit adhesive properties. Consequently, the patterned adhesive layer becomes a frame portion and a space enclosed by the semiconductor wafer, adhesive layer and lid part is formed, and thus it is possible to prevent external influences such as moisture and dust. Moreover, since the lid part is joined to the semiconductor wafer through the adhesive layer, it is possible to achieve a reduction in the size of a semiconductor device and realize high-quality and reliable chip-size semiconductor device. Further, since a semiconductor wafer in which semiconductor elements are formed has an uneven structure on the surface, foreign matter tends to be stuck. Therefore, when an adhesive layer containing a photo-curing adhesive and a thermosetting adhesive is patterned by exposure and development as in the case of the present invention, the adhesive layer tends to remain in the portions of the uneven structure from which the adhesive layer should be removed. However, by determining and knowing whether the patterned adhesive layer is satisfactory or not by inspecting each semiconductor element in the inspection step beforehand, it is possible to use the determination results in the subsequent steps and improve the production efficiency.

According to a manufacturing method of semiconductor wafer having a lid part of the present invention, in the above-described invention, in the second adhering step, the lid part is not placed on the adhesive layer of the semiconductor element determined to be unsatisfactory in the inspection step. Since the patterned adhesive layer is inspected for each semiconductor element and the lid part is not placed on the adhesive layer of the semiconductor element determined to be unsatisfactory (defective product), it is possible to achieve high manufacturing efficiency. For example, by identifying each semiconductor element by the manufacturing lot number, semiconductor wafer number and semiconductor chip number and creating identification information such as mapping data indicating whether the patterned adhesive layer is satisfactory or not for each semiconductor wafer, it is possible to accurately identify a semiconductor element whose patterned adhesive layer is determined to be unsatisfactory and not to place the lid part.

A manufacturing method of semiconductor wafer having a lid part of the present invention comprises: an adhesive layer forming step for forming an adhesive layer containing a photo-curing adhesive and a thermosetting adhesive on a semiconductor wafer in which a plurality of semiconductor elements are formed; a first adhering step for adhering the adhesive layer and the semiconductor wafer together by selectively exposing the adhesive layer to light and curing the photo-curing adhesive contained in the adhesive layer on a peripheral portion of each semiconductor element; a development step for patterning the adhesive layer by developing the adhesive layer and removing the adhesive layer in an area where the photo-curing adhesive has not cured; an inspection step for inspecting each semiconductor element to determine whether the patterned adhesive layer is satisfactory or not; a repairing step for repairing the adhesive layer having a defective portion and determined to be unsatisfactory in the inspection step with an adhesive containing a thermosetting adhesive; a lid part placing step for placing a lid part on the adhesive layer of the semiconductor element determined to be satisfactory in the inspection step and on the adhesive layer repaired in the repairing step; and a second adhering step for adhering the adhesive layer and the lid part together by heating the adhesive layer and causing the thermosetting adhesive contained in the adhesive layer to exhibit adhesive properties.

According to the present invention, an adhesive layer containing a photo-curing adhesive and a thermosetting adhesive is formed on a semiconductor wafer in which a plurality of semiconductor elements are formed, and the adhesive layer and the semiconductor wafer are adhered together by selectively exposing the adhesive layer to light and curing the photo-curing adhesive contained in the adhesive layer on the peripheral portion of each semiconductor element. Then, after developing the photo-curing adhesive and removing the adhesive layer in an area that has not been exposed, a determination is made for each semiconductor element as to whether the patterned adhesive layer is satisfactory or not. Then, after repairing the adhesive layer having a defective portion and determined to be unsatisfactory with an adhesive containing a thermosetting adhesive, a lid part is placed on the adhesive layer of the semiconductor element determined to be satisfactory and on the repaired adhesive layer, and the adhesive layer and the lid part are adhered together by heating the adhesive layer and causing the thermosetting adhesive contained in the adhesive layer to exhibit adhesive properties. Consequently, the patterned adhesive layer becomes a frame portion and a space enclosed by the semiconductor wafer, adhesive layer and lid part is formed, and thus it is possible to prevent the external influences such as moisture and dust. Moreover, since the lid part is joined to the semiconductor wafer through the adhesive layer, it is possible to achieve a reduction in the size of a semiconductor device and realize high-quality and reliable chip-size semiconductor device. Further, since the adhesive layer having a defective portion and determined to be unsatisfactory is repaired, it is possible to improve the manufacturing yield. By updating the identification information such as mapping data according to the repaired state, there is no possibility that the lid part will not be placed on the repaired adhesive layer, and it is possible to achieve high manufacturing efficiency and high yield. In addition, since a semiconductor wafer in which semiconductor elements are formed has an uneven structure on the surface, foreign matter is easily stuck. Therefore, when an adhesive layer containing a photo-curing adhesive and a thermosetting adhesive is patterned by exposure and development as in the case of the present invention, the adhesive layer tends to remain in the portions of the uneven structure from which the adhesive layer should be removed. However, by determining and knowing whether the patterned adhesive layer is satisfactory or not by inspecting each semiconductor element in the inspection step beforehand, it is possible to use the determination results in the subsequent steps and improve the production efficiency.

According to a manufacturing method of semiconductor wafer having a lid part of the present invention, in each invention described above, the adhesive layer is formed on the semiconductor wafer in the adhesive layer forming step by adhering an adhesive sheet containing a photo-curing adhesive and a thermosetting adhesive to the semiconductor wafer in which a plurality of semiconductor elements are formed. By adhering an adhesive sheet containing a photo-curing adhesive and a thermosetting adhesive to the semiconductor wafer in which a plurality of semiconductor elements are formed, the adhesive layer can be formed on the semiconductor wafer by a very simple method and low cost. Moreover, since it is possible to easily change the type of adhesive, this method is particularly suitable for the production of many types of semiconductor wafers.

According to a manufacturing method of semiconductor wafer having a lid part of the present invention, in the invention described above, protective films are attached to both sides of the adhesive sheet, and the adhesive sheet is adhered to the semiconductor wafer by separating the protective film on the side facing the semiconductor wafer in the adhesive layer forming step. By attaching protective films to both sides of the adhesive sheet and adhering the adhesive to the semiconductor wafer by separating the protective film on the side facing the semiconductor wafer, it is possible to supply the adhesive sheet by a very simple method and effectively, and it is possible to reduce the costs required for a manufacturing machine.

A manufacturing method of semiconductor wafer having a lid part of the present invention is based on the above-described invention, and further comprises the step of separating the other protective film after the first adhering step. By separating the other protective film after patterning the adhesive layer into a predetermined form by using the characteristic of the photo-curing adhesive contained in the adhesive layer, it is possible to keep the state in which the protective film is placed on the upper side of the adhesive layer until patterning, and therefore the surface of the adhesive layer will not have unevenness and can maintain smoothness, and it is also possible to prevent adhesion of dust to the surface of the adhesive layer in the manufacturing process.

According to a manufacturing method of semiconductor wafer having a lid part of the invention, in each invention described above, the lid part has a plane size smaller than a plane size of each semiconductor device so as to adhere the lid part to the adhesive layer of each semiconductor element. By using a lid part having a plane size smaller than the plane size of each semiconductor device into which the semiconductor wafer is divided later, the lid part can be adhered to the adhesive layer of each semiconductor element. Therefore, by not placing the lid part on the adhesive layer of the semiconductor element determined to be unsatisfactory, it is possible to achieve high manufacturing efficiency.

According to a manufacturing method of semiconductor wafer having a lid part of the invention, in each invention described above, the lid part has a plane size capable of covering a plurality of semiconductor devices so as to adhere the lid part to the adhesive layer of a plurality of semiconductor elements collectively. By using the lid part having a plane size capable of covering a plurality of semiconductor devices, it is possible to adhere the lid part to the adhesive layer of a plurality of semiconductor elements collectively, thereby significantly shortening the time. Moreover, since it is sufficient to place the lid part to come into contact with the adhesive layer of all the semiconductor elements, the alignment accuracy will not cause a problem.

According to a manufacturing method of semiconductor wafer having a lid part of the present invention, in each invention described above, micro-lenses are formed on the semiconductor wafer in which a plurality of semiconductor elements are formed. The manufacturing method of the invention is suitable for solid-state image pickup element including a micro-lense formed on a semiconductor wafer in which a plurality of semiconductor elements are formed, and can realize chip-size solid-state image pickup devices. On the surface of a semiconductor wafer on which micro-lenses are formed, foreign matter is easily stuck. Therefore, when patterning an adhesive layer containing a photo-curing adhesive and a thermosetting adhesive by exposure and development as in the case of the present invention, if micro-lenses are formed, particularly the adhesive layer tends to remain in a portion from which the adhesive layer should be removed. However, by inspecting each semiconductor element to determine whether the patterned adhesive layer is satisfactory or not in the inspection step beforehand and, for example, not performing the subsequent steps on the semiconductor element determined to be unsatisfactory, it is possible to improve the production efficiency very effectively.

A manufacturing method of semiconductor device of the present invention is based on each invention described above, and further comprises a dividing step for cutting and dividing the semiconductor wafer into individual semiconductor devices having a lid part. By cutting and dividing the semiconductor wafer into individual semiconductor devices having a lid part adhered thereto, it is possible to prevent adhesion of dust and scratches on the surface of the semiconductor elements after the dividing step. Further, since the processing is performed on the basis of a semiconductor wafer unit until the lid part is adhered, it is possible to easily and safely store and transport the semiconductor wafer, and it is also possible to easily manage the processing.

The above and further objects and features of the invention will more fully be apparent from the following detailed description with accompanying drawings.

DETAILED DESCRIPTION OF THE INVENTION

The following description will explain in detail the present invention, based on the drawings illustrating some embodiments thereof. Note that the following description explains the present invention applied to the manufacture of a solid-state image pickup device as a semiconductor device, such as a CCD and a CMOS imager, in which a semiconductor wafer is a silicon wafer.

Embodiment 1

Figure 1:
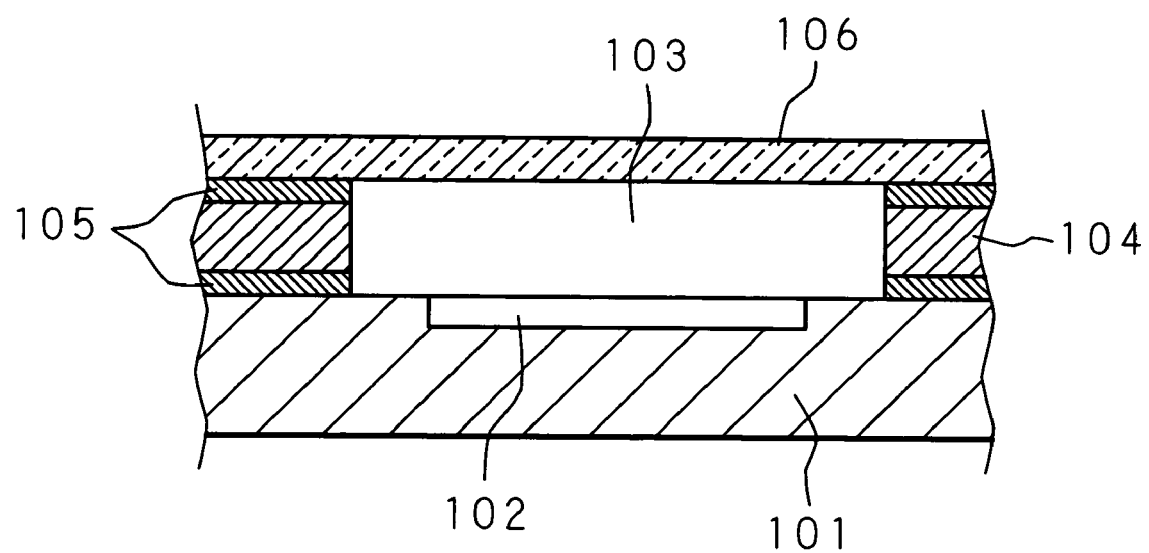
FIG. 1 is a cross sectional view showing the structure of a solid-state image pickup device.
Figure 2:
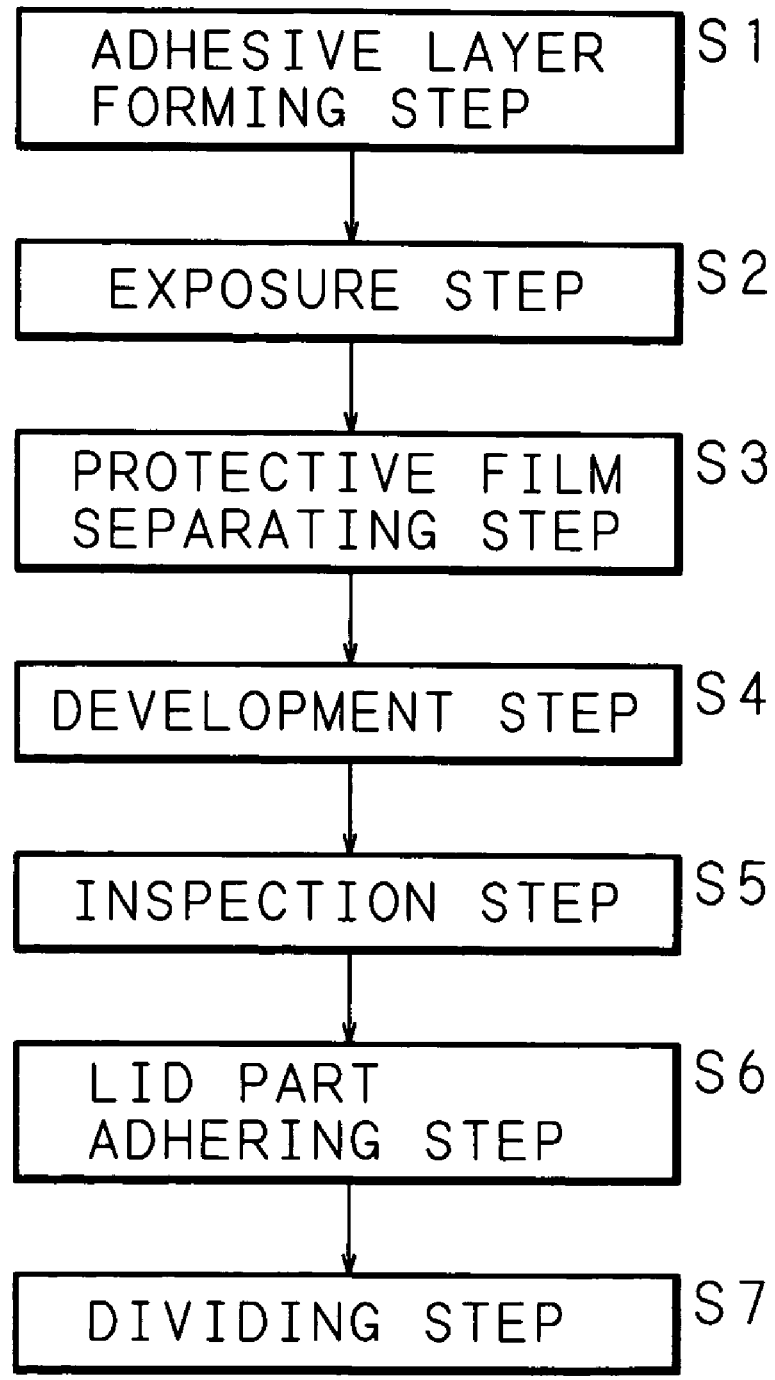
FIG. 2 is a flowchart showing an outline of a manufacturing method of semiconductor wafer and a manufacturing method of semiconductor device according to Embodiment 1 of the present invention.

FIG. 2 is a flowchart showing an outline of a manufacturing method of semiconductor wafer and a manufacturing method of semiconductor device according to Embodiment 1 of the present invention, and FIGS. 3A–3H are explanatory views for explaining the manufacturing method of semiconductor wafer and the manufacturing method of semiconductor device according to Embodiment 1 of the present invention.

The manufacturing method of semiconductor wafer according to Embodiment 1 comprises an adhesive layer forming step (S1), an exposure step as a first adhering step (S2), a protective film separating step (S3), a development step (S4), an inspection step (S5) and a lid part adhering step as a second adhering step (S6), and the manufacturing method of semiconductor device further comprises a dividing step (S7).

Figure 3A:
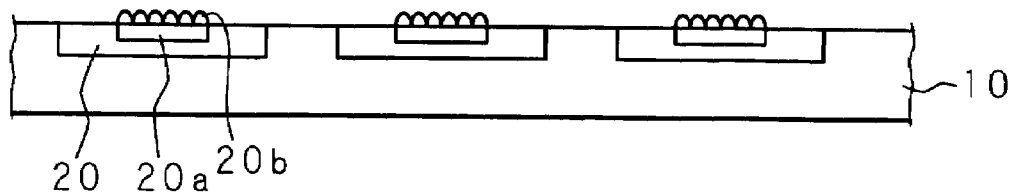
FIGS. 3A–3H are explanatory views for explaining the manufacturing method of semiconductor wafer and the manufacturing method of semiconductor device according to Embodiment 1 of the present invention.

In a semiconductor wafer 10, a plurality of image pickup elements 20, 20, . . . that are semiconductor elements, such as CCDs and CMOS imagers, having a rectangular shape in the plan view are formed (FIG. 3A). A light receiving section 20$a$ is formed in a substantially center area of the solid-state image pickup element 20, and micro-lenses 20$b$ are formed on the upper surface of the light receiving section 20$a$. More specifically, the light receiving section 20$a$ is a photodiode, and increases the light gathering power to the light receiving section 20$a$ by the micro-lenses 20$b$. The micro-lenses 20$b$ are formed on the surface of the semiconductor wafer 10 by processing a translucent resin into a lens shape.

Figure 3B:
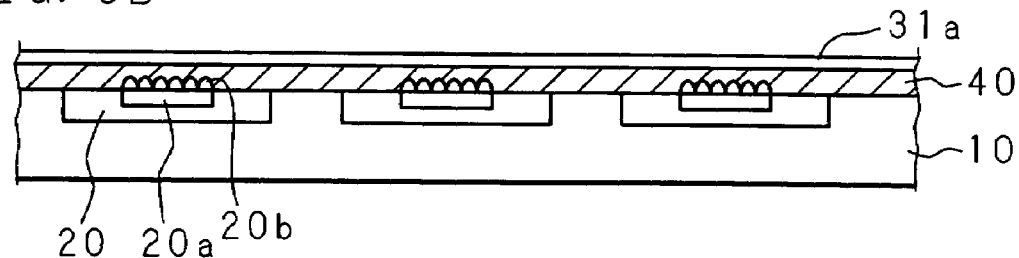

First, as the adhesive layer forming step (FIG. 2: S1), an adhesive layer 40 with a protective film 31a attached to the upper side thereof is formed on the light receiving-side surface of the semiconductor wafer 10 in which a plurality of solid-state image pickup elements 20 are formed (FIG. 3B). The adhesive layer 40 is a material obtained by suitably mixing a photo-curing adhesive that cures when exposed to light and a thermosetting adhesive that exhibits adhesive strength when heated, and has a thickness thicker than the micro-lenses. As the photo-curing adhesive, for example, an ultraviolet (UV) curing resin that is an acrylic resin is used, and as the thermosetting adhesive, for example, an epoxy-based resin is used. In the adhesive layer forming step, it is just necessary to form the adhesive layer 40 on all of a plurality of solid-state image pickup elements 20, 20, . . . formed in the semiconductor wafer 10, and there is no restriction in terms of the alignment accuracy.

Figure 4A:
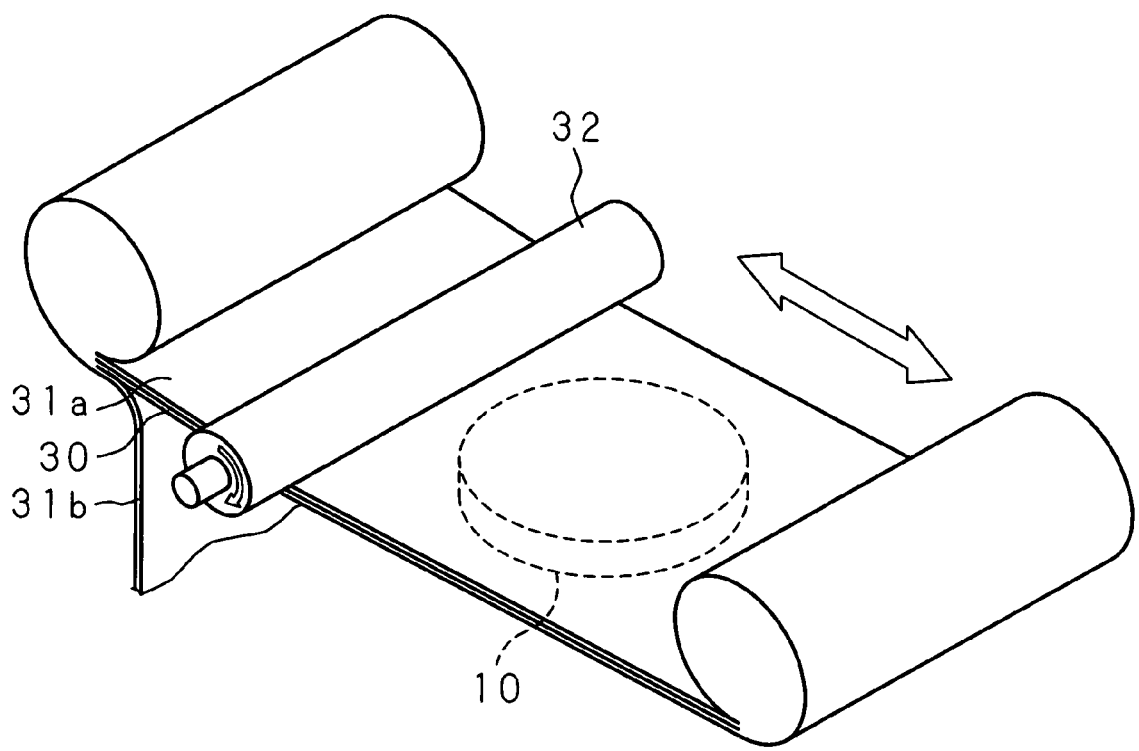
FIGS. 4A and 4B are explanatory views for explaining an adhesive layer forming step.
Figure 4B:
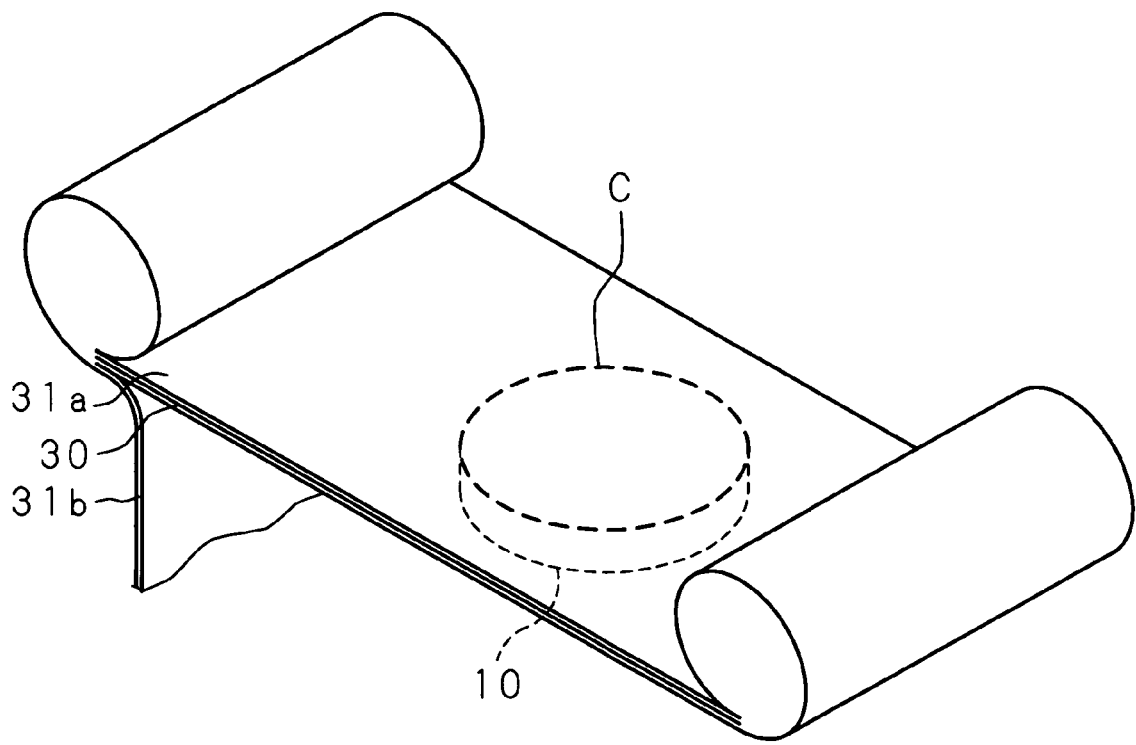

More specifically, in the adhesive layer forming step, as shown in FIGS. 4A and 4B, an adhesive sheet 30 is rolled in a state in which protective films 31a and 31b are attached to both sides of the adhesive sheet 30, the protective film 31a on one side (here, the lower side) is separated, and an attaching roller 32 is rotated so that the attaching roller 32 is moved in the left and right directions and the surface of the adhesive sheet 30 from which the protective film has been separated comes into contact with the semiconductor wafer 10 and is adhered to the semiconductor wafer 10 (FIG. 4A). The other side of the adhesive sheet 30 maintains the protective film 31a attached thereto. Then, the adhered adhesive sheet 30 is cut along the outer circumference of the semiconductor wafer 10 (shown by reference code C) to make the adhesive layer 40 (FIG. 4B).

Figure 3C:
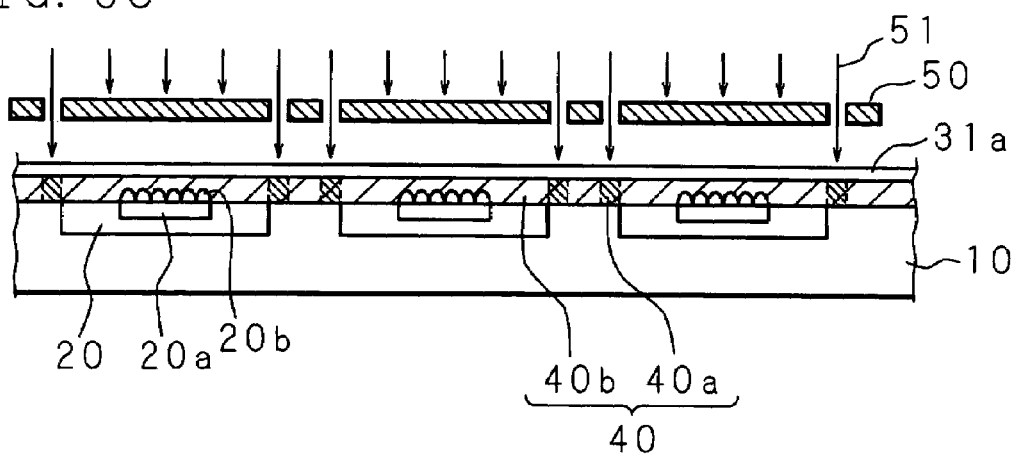

Next, as the exposure step (FIG. 2: S2), the adhesive layer 40 is exposed to light 51 through a photo mask 50 (FIG. 3C). In this example, since a UV curing resin that exhibits curing characteristic with respect to ultraviolet radiation (UV light) is used as the photo-curing adhesive contained in the adhesive layer 40, UV light is used as the light 51. The photo mask 50 is patterned so that an outside area of an area corresponding to the light receiving section 20a of each of the solid-state image pickup elements formed in the semiconductor wafer 10 is exposed. Since the photo-curing adhesive is mixed in the adhesive layer 40, when the adhesive layer 40 is exposed (sensitized) to UV light, the curing characteristic appears, and the photo-curing adhesive causes a photo polymerization reaction and is changed into a substance that is not dissolved in a predetermined developer. In short, in the adhesive layer 40, an adhesive layer 40a sensitized to UV light has cured, while an adhesive layer 40b that was not sensitized to UV light maintains an uncured state.

Figure 3D:
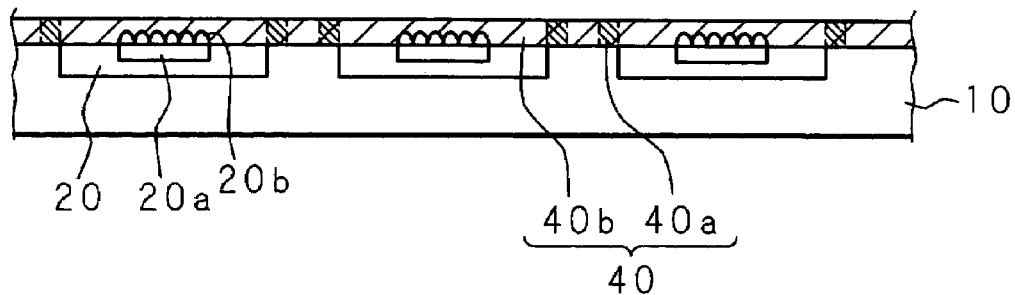

Then, as the protective film separating step (FIG. 2: S3), in order to expose the adhesive layer 40, the protective film 31a on the upper side of the adhesive layer 40 is separated (FIG. 3D). If the protective film 31a is separated before exposing the adhesive layer 40, the adhesive contained in the adhesive layer 40 adheres to the protective film 31a due to the adhesion of the adhesive layer 40, and the surface of the adhesive layer 40 may become uneven. However, by maintaining the state in which the protective film 3 la is placed on the upper side of the adhesive layer 40 until the exposure of the adhesive layer 40, the surface of the adhesive layer 40 does not become uneven and can maintain smoothness, and it is also possible to prevent adhesion of dust to the surface of the adhesive layer 40 during the manufacturing process. After exposure, since the photo-curing adhesive in the adhesive layer 40a in a portion used for adhesion to the lid part later has cured, even if the protective film 31a is separated from the adhesive layer 40, unevenness will not be caused on the surface of the necessary portion of the adhesive layer 40a, and the smoothness of the surface is maintained.

Figure 3E:
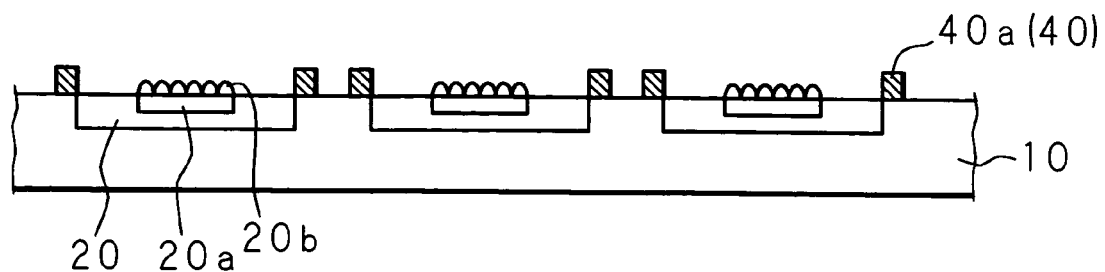

Then, as the development step (FIG. 2: S4), by developing the adhesive layer 40 with a predetermined developer, the adhesive layer 40b in the area that was not sensitized to UV light is removed, while the adhesive layer 40a remains and provides a pattern (FIG. 3E). Consequently, the adhesive layer 40a has a shape surrounding the light receiving section 20a of each of the solid-state image pickup elements 20, or, in other words, becomes a frame portion. The photo-curing adhesive in the adhesive layer 40a sensitized to UV light causes a photo-polymerization reaction when sensitized and is not dissolved in a predetermined developer, whereas the photo-curing adhesive in the adhesive layer 40b that was not sensitized to UV light has no change in the physical property and is dissolved in the developer. Since a material obtained by suitably mixing a photo-curing adhesive and a thermosetting adhesive is used as the material of the adhesive layer 40, it is possible to pattern the above-mentioned adhesive layer 40 into a predetermined form using a photolithography technique.

Figure 3F:
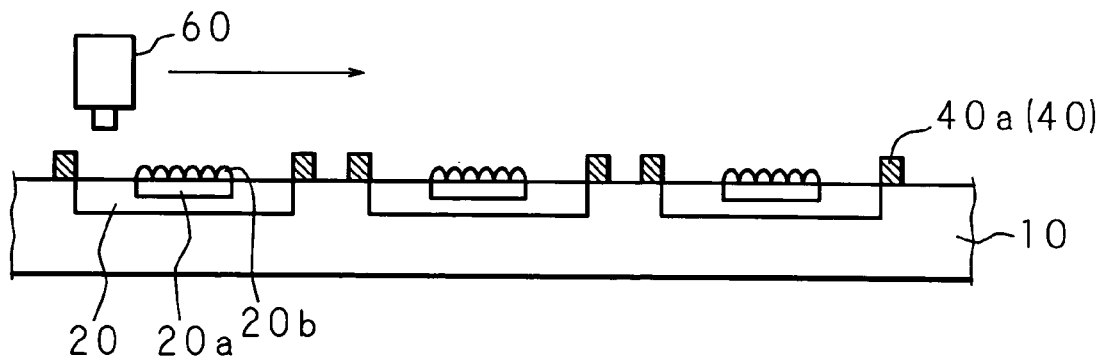

Then, as the inspection step (FIG. 2: S5), the patterned adhesive layer 40 on the surface of the semiconductor wafer 10 is inspected using a camera 60 to determine whether the adhesive layer 40 is satisfactory or not (FIG. 3F). The reason why inspecting the surface is that the surface of the semiconductor wafer 10 may have unevenness due to various patterns stacked, and a residue of the adhesive layer 40b may remain due to the unevenness. In the inspection step, the presence of a residue of the adhesive layer 40b that cannot be removed in the development step and the presence of defects in the shape of the adhesive layer 40a are inspected. In particular, in the case of a solid-state image pickup element with micro-lenses formed on the surface as in this example, since there is a high possibility that a residue remains in the space between adjacent micro-lenses, it is effective to perform the inspection step to inspect the presence of a residue.

Figure 5:
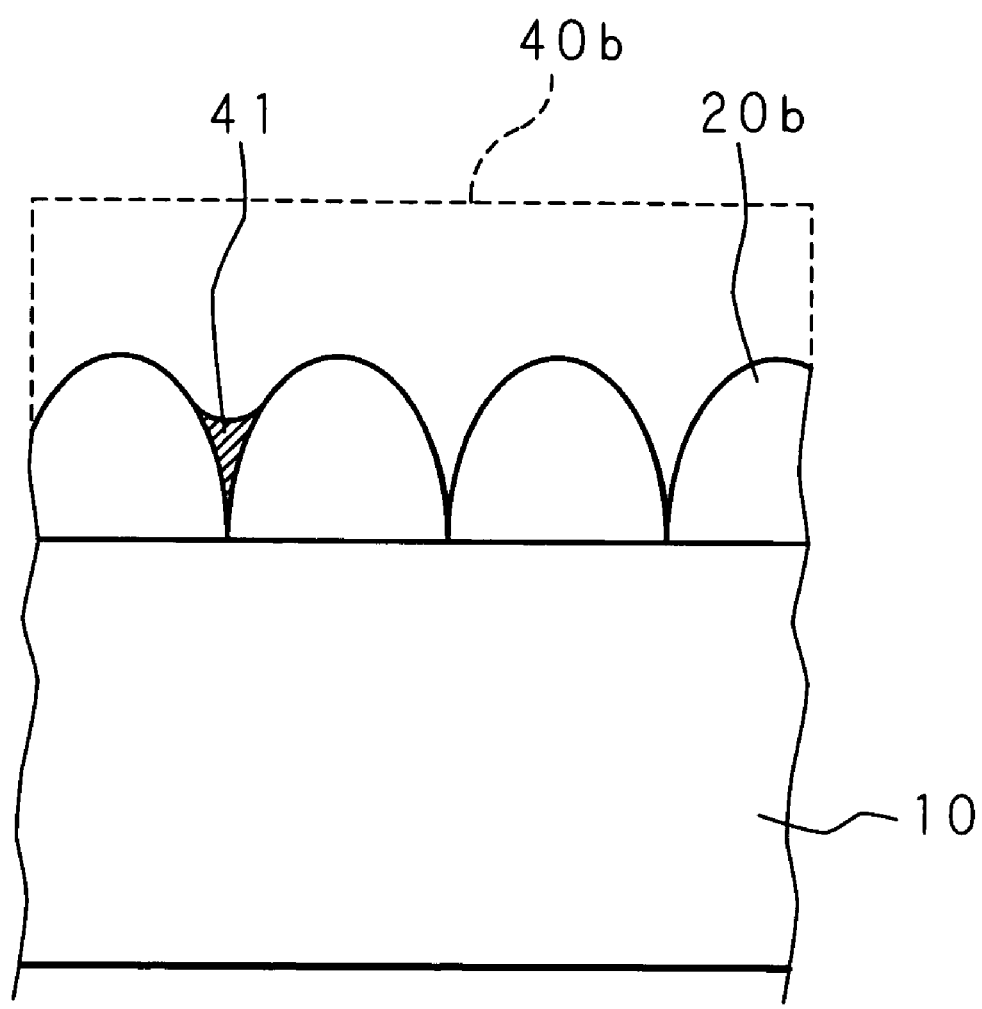
FIG. 5 is a view showing the state of one example of a residue of the adhesive layer.
Figure 6:
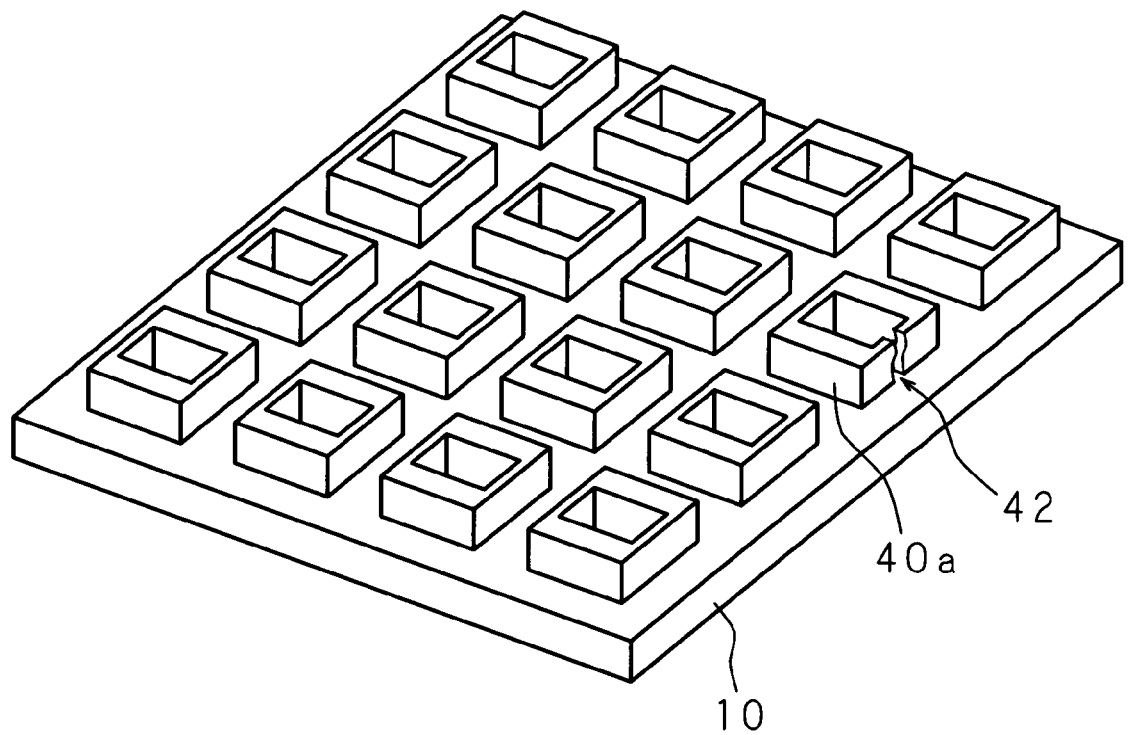
FIG. 6 is a view showing the state of one example of shape defect of the adhesive layer.

As the residue of the adhesive layer 40b, as shown in FIG. 5, for example, although the adhesive layer 40b should be removed in the development step, a residue 41 is likely caused on the uneven upper surface of the micro-lenses 20b due to processing variation. Moreover, as the shape defect of the adhesive layer 40a, as shown in FIG. 6, for example, a defective portion 42 may be caused in a part of the pattern of the adhesive layer 40a formed on the semiconductor wafer 10. Thus, in order to identify which solid-state image pickup device becomes defective by inspecting the presence of such a residue of the adhesive layer 40b and the presence of a shape defect of the adhesive layer 40a, mapping data produced by a flag showing a result of determination of each solid-state image pickup device or each solid-state image pickup element.

In the manufacture of semiconductors, each semiconductor element is identified by the manufacturing lot number, semiconductor wafer number and semiconductor chip number, and mapping data is created for each semiconductor wafer. In short, mapping data is created for each manufacturing lot number and each semiconductor wafer number, and it is possible to make a determination based on the mapping data as to whether each solid-state image pickup device or each solid-state image pickup element is satisfactory or not. As the mapping data, in addition to the flag showing the result of determination as to whether each solid-state image pickup device or each solid-state image pickup element is satisfactory or not, it may be possible to include information for identifying the content. For example, when there is a residue, information identifying this fact is added to the mapping data, and when there is a defective portion, information identifying this fact is added to the mapping data. Hence, based on the information of mapping data, it is possible to identify an item causing a defect and sort the defect percentage according to each item, and thus mapping data is suitable for examining the lot history.

Figure 3G:
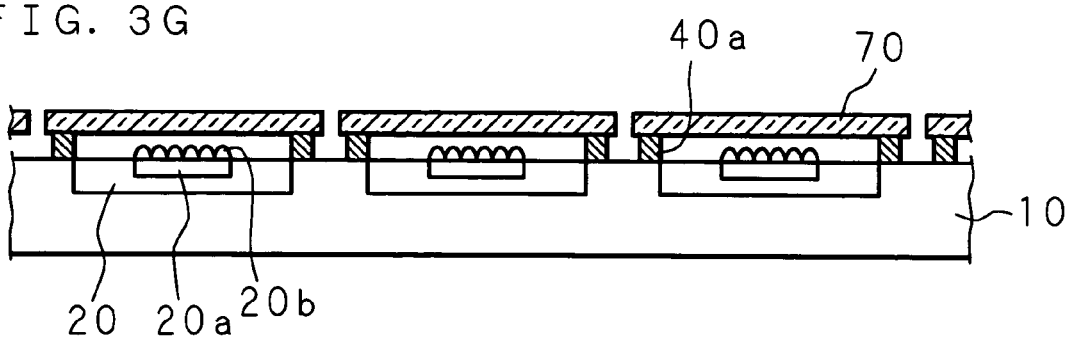

Then, as the lid part adhering step (FIG. 2: S6), in this example, a translucent lid part 70 made of glass, etc, separated into individual pieces beforehand is arranged on the adhesive layer 40a of each solid-state image pickup element 20, and the adhesive layer 40a and the lid part 70 are adhered together (FIG. 3G). Note that the plane size of the lid part 70 is preferably small and preferably substantially equal to the plane size of the adhesive layer 40a that is a frame portion surrounding the light receiving section 20a of each solid-state image pickup element 20. When performing wire bonding to connect a pad (not shown) formed on the semiconductor wafer 10 to an external circuit, if the pad is hidden by the lid part 70, it is necessary to make a suitable adjustment to a bonding machine, but wire bonding can be easily performed by making the plane size of the lid part 70 small. Moreover, if the accuracy in placing the lid part 70 is taken into consideration, the plane size of the lid part 70 is preferably slightly larger than the plane size of the adhesive layer 40a that is the frame portion surrounding the light receiving section 20a of each solid-state image pickup element 20.

Figure 7A:
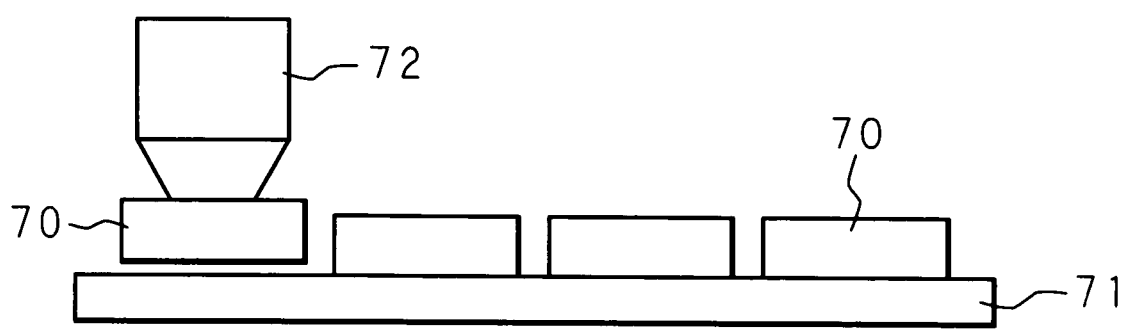
FIGS. 7A and 7B are explanatory views for explaining a lid part adhering step.
Figure 7B:
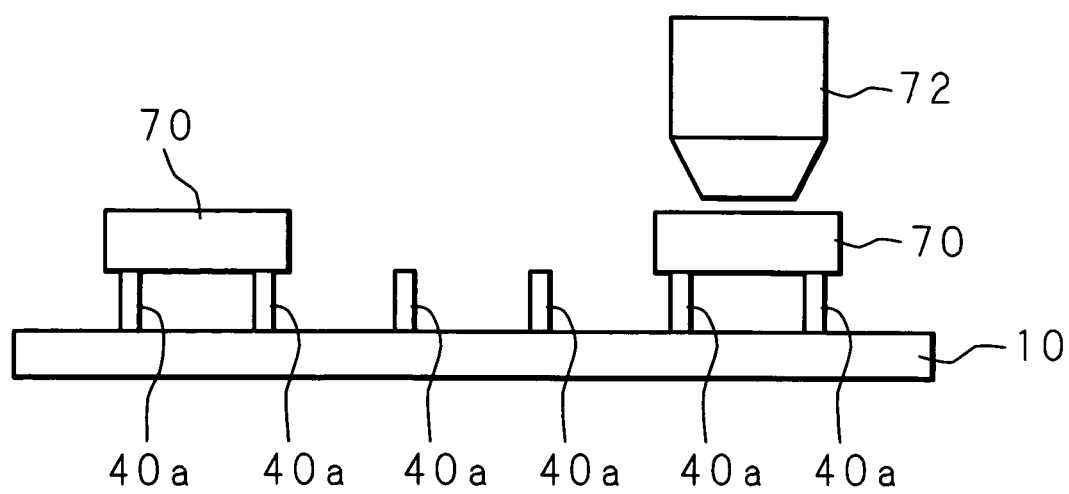

More specifically, in the lid part adhering step, as shown in FIGS. 7A and 7B, a sticky sheet 71 with the lid parts 70 attached thereto is prepared, and the lid part 70 is sucked by a suction device 72 such as a lid bonder and separated from the sticky sheet 71 (FIG. 7A). Then, the suction device 72 is moved to place the lid part 70 on the adhesive layer 40a of each of the solid-state image pickup elements 20 formed in the semiconductor wafer 10 (FIG. 7B). By applying heat in the state in which the lid part 70 is placed on the adhesive layer 40a, adhesive properties appear in the thermosetting adhesive contained in the adhesive layer 40a, and the adhesive layer 40a and the lid part 70 are adhered together. Moreover, since the adhesive layer 40a and the semiconductor wafer 10 are not sufficiently adhered together by only the adhesive strength of the photo-curing adhesive produced in the exposure step, the adhesion between the adhesive layer 40a and the semiconductor wafer 10 is improved by this heating process. Of curse, it may be possible to cause the adhesive properties by placing the adhesive layer in a high-temperature vessel of a predetermined temperature, or by applying suitably pressure during heating. Consequently, a space is produced by the semiconductor wafer 10, lid part 70 and adhesive layer 40a, and it is possible to reduce occurrence of defect in the light receiving section 20a due to entry of moisture into the light receiving section 20a, entry and adhesion of dust, scratches, etc., in the subsequent steps, and it is possible to manufacture highly reliable solid-state image pickup device with good yields. Note that the space formed by the semiconductor wafer 10, lid part 70 and adhesive layer 40a may be sealed, or may be closed to a degree capable of reducing occurrence of defect in the light receiving section 20a due to entry of moisture into the light receiving section 20a, entry and adhesion of dust, scratches, etc., and, for example, a small air channel may be formed for discharging the moisture entered inside to the outside.

Note that in the case where the solid-state image pickup device is mounted in an optical device such as a camera and a video recorder camera, the lid part 70 needs to block external infrared radiation in addition to protecting the surface of the light receiving section 20a from dust, scratches, etc. In this case, it may be possible to form an infrared blocking film on the surface of the lid part 70 to also perform the function of an optical filter.

Further, as shown in FIG. 7B, it is preferred not to attach the lid part 70 to the adhesive layer 40a (adhesive layer at the center area) of a solid-state image pickup device or a solid-state image pickup element determined to be defective in the inspection step. By not attaching the lid part 70 to a defective product, it is possible to reduce the cost of material of the lid part 70 and the manufacturing cost in the adhering step. From the point of view of reducing the cost, it is preferred to select defective products in the upstream steps and not to subject the detective products to the downstream steps.

Figure 3H:
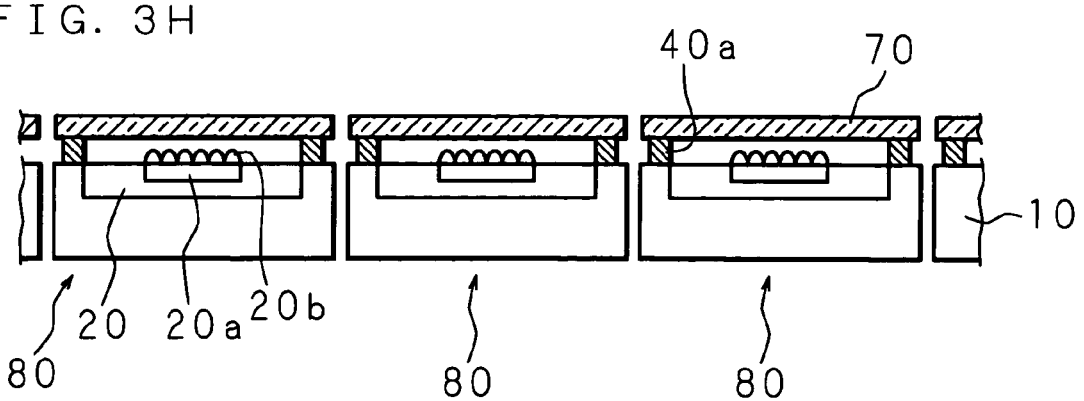

Then, as the dividing step (FIG. 2: S7), after adhering the lid parts 70 to the adhesive layers 40a corresponding to all good solid-state image pickup devices or solid-state image pickup elements in the lid part adhering step, the semiconductor wafer 10 is cut with a dicing device such as a dicing saw to divide it into solid-state image pickup devices 80 including individual solid-state image pickup elements 20 (FIG. 3H). As the dividing step, the rear surface of the semiconductor wafer 10 to which the lid parts 70 are joined through the adhesive layer 40a is attached onto a dicing tape fixed to a dicing ring, and the dicing saw is moved in the dicing direction to divide the semiconductor wafer 10 into individual solid-state image pickup devices 80. Then, by separating the divided solid-state image pickup devices 80 from the dicing tape under suitable conditions, it is possible to obtain the solid-state image pickup devices 80. Note that it may also be possible to provide the semiconductor wafer 10 with dividing lines such as known dicing lines and bevel cut lines to improve the dicing accuracy.

As described in detail above, the point of the present invention is to use a material obtained by suitably mixing a photo-curing adhesive and a thermosetting adhesive as the material of the adhesive layer 40 for joining the semiconductor wafer 10 and the lid part 70 together and pattern the adhesive layer 40 into a predetermined form by a photolithography technique by first using the characteristic of the photo-curing adhesive contained in the adhesive layer 40. Then, after placing the lid part 70, by heating the remaining adhesive layer 40a, the semiconductor wafer 10 and the lid part 70 are joined together through the adhesive layer 40a by using the characteristic of the thermosetting adhesive contained in the adhesive layer 40a. In such a method, when patterning the adhesive layer 40, a residue may be caused due to uneven shape such as micro-lenses. Therefore, the present invention performs an inspection step to determine the presence or absence of a residue. Moreover, since there is a possibility that a part of the adhesive layer 40a to be the frame portion of each solid-state image pickup element 20 may be defective, an inspection is also performed for such a defect in the inspection step.

Embodiment 2

Figure 8:
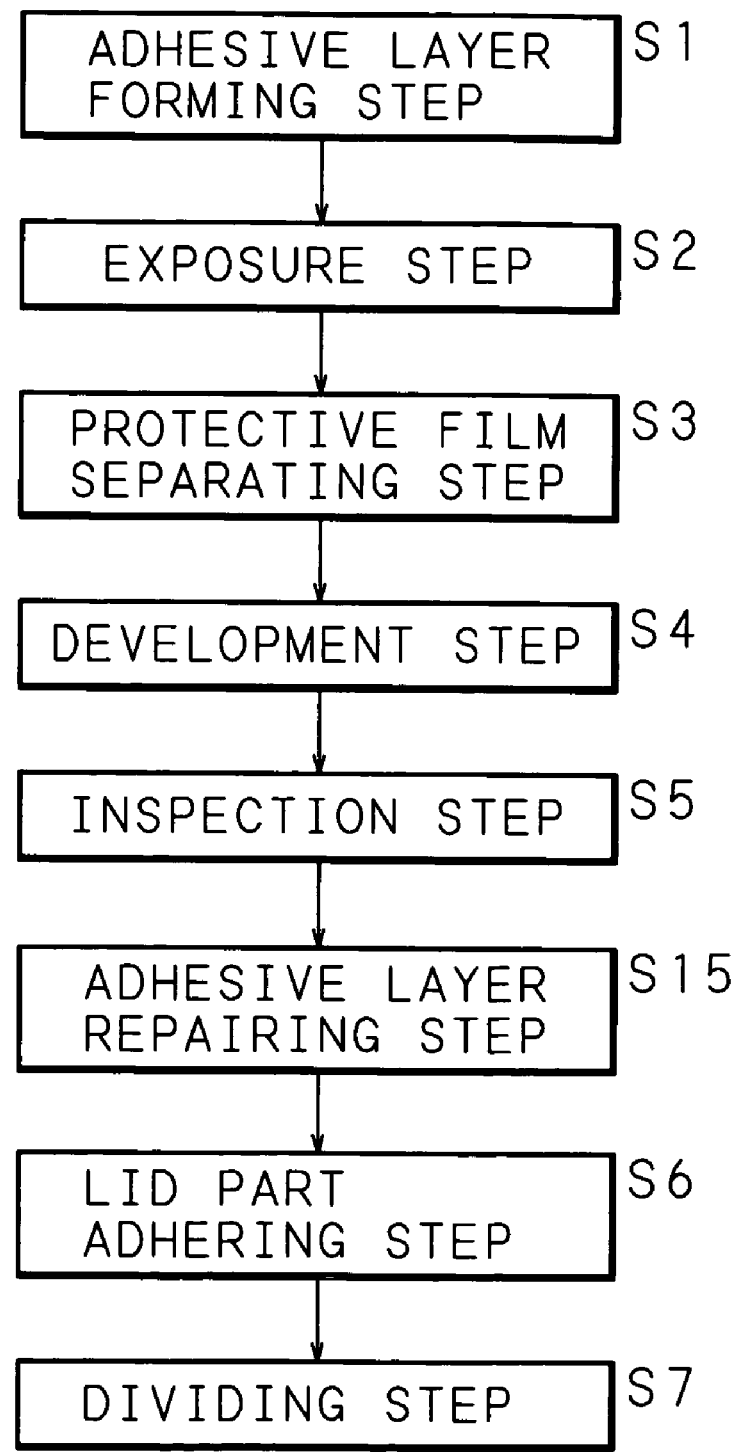
FIG. 8 is a flowchart showing an outline of a manufacturing method of semiconductor wafer and a manufacturing method of semiconductor device according to Embodiment 2 of the present invention.

FIG. 8 is a flowchart showing an outline of a manufacturing method of semiconductor wafer and a manufacturing method of semiconductor device according to Embodiment 2 of the present invention.

The manufacturing method of semiconductor wafer according to Embodiment 2 comprises an adhesive layer forming step (S1), an exposure step (S2), a protective film separating step (S3), a development step (S4), an inspection step (S5), an adhesive layer repairing step (S15) and a lid part adhering step (S6), and the manufacturing method of semiconductor device further comprises a dividing step (S7).

Figure 9:
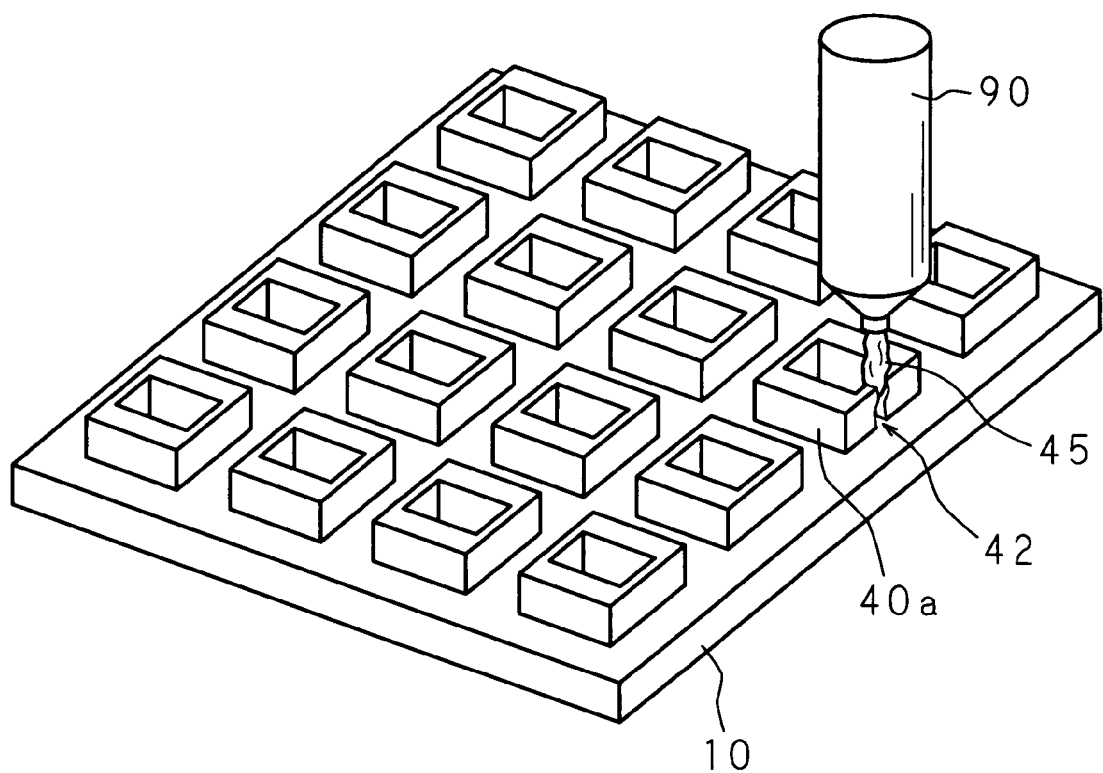
FIG. 9 is an explanatory view for explaining an adhesive layer repairing step.

In the adhesive layer repairing step (S15), based on the mapping data created in the inspection step (S5), the adhesive layer 40 having no a residue of the adhesive layer 40b and determined to be defective due to the presence of a defective portion 42 in a part of the pattern of the adhesive layer 40a is repaired. For example, as shown in FIG. 9, the defective portion 42 may be filled with an adhesive 45 by using a dispenser as an adhesive syringe. The adhesive 45 for use in the adhesive layer repairing step contains a thermosetting adhesive similar to that used in the adhesive layer forming step.

Therefore, the adhesive 45 has adhesive properties by the heating process in the lid part adhering step, and adheres to the lid part 70 and the semiconductor wafer 10. Thus, similarly to Embodiment 1, a space is produced by the semiconductor wafer 10, lid part 70, adhesive layer 40a and adhesive 45, and it is possible to reduce occurrence of defect in the light receiving section 20a due to entry of moisture into the light receiving section 20a, entry and adhesion of dust, scratches, etc. in the subsequent steps, and it is possible to manufacture highly reliable solid-state image pickup device with good yield. Note that, in this embodiment, the space formed by the semiconductor wafer 10, lid part 70 and adhesive layer 40a may be sealed, or may be closed to a degree capable of reducing occurrence of defect in the light receiving section 20a due to entry of moisture into the light receiving section 20a, entry and adhesion of dust, scratches, etc., and, for example, a small air channel may be formed for discharging the moisture entered inside to the outside.

Moreover, since a defective solid-state image pickup device is repaired to make a good product, the manufacturing yield is improved as a matter of course. When the adhesive layer 40a is repaired in the adhesive layer repairing step, the flag of the repaired solid-state image pickup device is changed to a good product and updated appropriately in the mapping data given to each semiconductor wafer in the inspection step. Since other steps are the same as those in Embodiment 1, the corresponding parts are designated with the same codes and the detailed explanation thereof is omitted.

Further, it may also be possible to re-inspect the shape of the adhesive layer 40a including the adhesive 45 used for repairing in the adhesive layer repairing step and to determine whether or not the adhesive layer 40a has been repaired into a predetermined shape. As the re-inspection method, it is possible to use the same method as in the above-described inspection step (S5). When performing the re-inspection, since there is no need to inspect the adhesive layer 40a determined to be a good product in the inspection step (S5), it is preferred from the throughput point of view to inspect only the adhesive layer 40a of the repaired part.

Embodiment 3

Embodiments 1 and 2 illustrate a mode in which the translucent lid part 70 made of glass, etc, and separated into individual pieces beforehand is placed on the adhesive layer 40a of each of the solid-state image pickup elements 20, and the adhesive layer 40a and the lid part 70 are adhered together. However, it may also be possible to adhere a translucent lid part in the form of a single plate (one piece of plate) with a size capable of covering a plurality of solid-state image pickup devices (semiconductor devices), and such a structure is explained as Embodiment 3. A manufacturing method of semiconductor wafer and a manufacturing method of semiconductor device according to Embodiment 3 are the same in the flow as Embodiments 1 and 2, but differ in the details of the lid part adhering step and the dividing step.

Figure 10A:
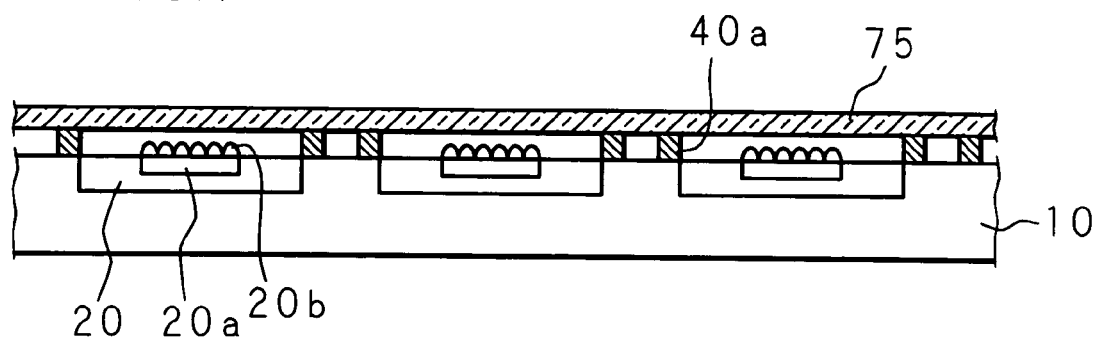
FIGS. 10A and 10B are explanatory views for explaining a manufacturing method of semiconductor wafer and a manufacturing method of semiconductor device according to Embodiment 3 of the present invention.
Figure 10B:
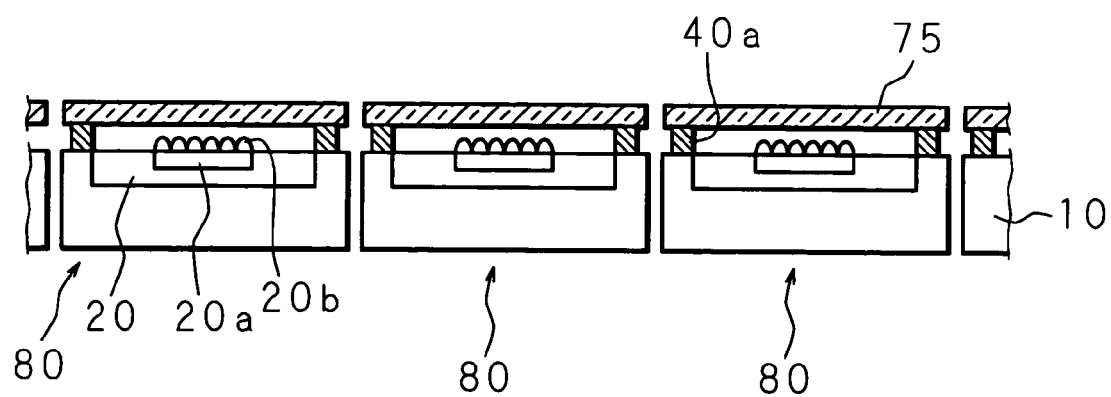

FIGS. 10A and 10B are explanatory views for explaining the manufacturing method of semiconductor wafer and the manufacturing method of semiconductor device according to Embodiment 3 of the present invention, and more specifically are explanatory views showing the lid part adhering step and the dividing step.

In the lid part adhering step in the manufacturing method of semiconductor wafer and the manufacturing method of semiconductor device according to Embodiment 3, a translucent lid part 75 in the form of a single plate is placed on the adhesive layer 40a of the respective solid-state image pickup elements 20 collectively, and the adhesive layer 40a and the lid part 75 are adhered together (FIG. 10A). Since the lid part 75 in the form of a single plate is placed, it is sufficient to just place the lid part 75 to come into contact with the adhesive layer 40a of all the solid-state image pickup elements 20, and the alignment accuracy is not important. Moreover, by placing the lid part 75 in the form of a single plate, it is possible to cover all the solid-state image pickup elements 20 collectively, thereby achieving a significant reduction in the manufacturing time.

Then, by applying heat in the state in which the lid part 75 is attached onto the adhesive layer 40a, the thermosetting adhesive contained in the adhesive layer 40a is caused to exhibit adhesive properties, and the adhesive layer 40a and the lid part 75 are adhered together. Moreover, with this heating, the adhesion between the adhesive layer 40a and the semiconductor wafer 10 is improved. Of course, adhesive properties may be exhibited by placing the adhesive layer in a high-temperature vessel of a predetermined temperature, or applying suitable pressure during heating. Thus, a space is individually produced by the semiconductor wafer 10, lid part 75 and adhesive layer 40a, and it is possible to reduce occurrence of defect in the light receiving section 20a due to entry of moisture into the light receiving section 20a, entry and adhesion of dust, scratches, etc. in the subsequent steps, and it is possible to manufacture highly reliable solid-state image pickup device with good yield. Note that the space formed by the semiconductor wafer 10, lid part 75 and adhesive layer 40a may be sealed, or may be closed to a degree capable of reducing occurrence of defect in the light receiving section 20a due to entry of moisture into the light receiving section 20a, entry and adhesion of dust, scratches, etc. in the subsequent steps, and, for example, a small air channel may be formed for discharging the moisture entered inside to the outside.

Then, in the dividing step, the semiconductor wafer 10 and the lid part 75 are cut with a dicing device and divided into solid-state image pickup devices 80 including individual solid-state image pickup elements 20 (FIG. 10B). When performing wire bonding to connect a pad (not shown) formed on the semiconductor wafer 10 and an external circuit, if the pad is hidden by the lid part 75, a suitable adjustment needs to be made to a bonding device. Therefore, in the dividing step, the semiconductor wafer 10 and the lid part 75 are suitably cut so that the plane size of the cut lid part 75 is smaller than the plane size of the cut semiconductor wafer 10 (solid-state image pickup device (semiconductor device)).

Note that although each embodiment explains a case in which the present invention is applied to a solid-state image pickup device, the present invention is not limited to this, and is applicable to a whole range of semiconductor devices and is especially effective for a semiconductor device comprising a light receiving section with a translucent lid part, for example, a solid-state image pickup devices such as a CCD and CMOS imager, and a semiconductor device such as EPROM (erasable Programmable Read Only Memory). Moreover, although the lid part made of translucent glass has been explained, the present invention is not limited to this, and, for example, it may be possible to use a lid part made from a resin material, or use a lid part having no light transmitting property in some case. As an example, in the case where the present invention is applied to a semiconductor wafer using a semiconductor substrate, such as silicon substrate, as a non-glass lid part, a silicon piece for a protection cap is adhered as the lid part to the silicon wafer in which functional elements are formed. Further, in an example in which the present invention is applied to a semiconductor device using a semiconductor substrate such as silicon substrate, a silicon wafer to which the silicon piece for a protection cap is adhered is cut.

According to the present invention, as described above, the adhesive layer made of a material obtained by suitably mixing a photo-curing adhesive and a thermosetting resin is formed on a semiconductor wafer and patterned into a predetermined form by using the characteristic of the photo-curing adhesive contained in the adhesive layer, and after placing a lid part, the semiconductor wafer and the lid part are adhered together through the adhesive layer by using the characteristic of the thermosetting adhesive contained in the adhesive layer. Consequently, a space is formed, and it is possible to reduce the influences of moisture and dust from outside, and it is also possible to achieve a decrease in the size of a semiconductor device and realize a high-quality and reliable chip-size semiconductor device. Moreover, according to the present invention, by performing an inspection on each semiconductor element as to whether the patterned semiconductor layer is satisfactory or not and by not placing the lid part on the semiconductor layer of a semiconductor element determined to be unsatisfactory, it is possible to increase the manufacturing efficiency. Further, according to the invention, by performing an inspection on each semiconductor element as to whether the patterned semiconductor layer is satisfactory or not and repairing the semiconductor layer having a defective portion determined to be unsatisfactory, it is possible to increase the manufacturing yield.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A manufacturing method of semiconductor wafer having a lid part, comprising:
    an adhesive layer forming step for forming an adhesive layer containing a photo-curing adhesive and a thermosetting adhesive on a semiconductor wafer in which a plurality of semiconductor elements are formed;
    a first adhering step for adhering the adhesive layer and the semiconductor wafer together by selectively exposing the adhesive layer to light and curing the photo-curing adhesive contained in the adhesive layer on a peripheral portion of each semiconductor element;
    a development step for patterning the adhesive layer by developing the adhesive layer and removing the adhesive layer in an area where the photo-curing adhesive has not cured;
    an inspection step for inspecting each semiconductor element to determine whether the patterned adhesive layer is satisfactory or not;
    a lid part placing step for placing a lid part on the adhesive layer of the semiconductor element determined to be satisfactory in the inspection step; and
    a second adhering step for adhering the adhesive layer and the lid part together by heating the adhesive layer and causing the thermosetting adhesive contained in the adhesive layer to exhibit adhesive properties.

2. The manufacturing method of semiconductor wafer of claim 1, wherein
    in the second adhering step, the lid part is not placed on the adhesive layer of the semiconductor element determined to be unsatisfactory in the inspection step.

3. The manufacturing method of semiconductor wafer of claim 1, wherein
    in the adhesive layer forming step, the adhesive layer is formed on the semiconductor wafer by adhering an adhesive sheet containing a photo-curing adhesive and a thermosetting adhesive to the semiconductor wafer in which a plurality of semiconductor elements are formed.

4. The manufacturing method of semiconductor wafer of claim 3, wherein
    protective films are attached to both sides of the adhesive sheet, and
    in the adhesive layer forming step, the adhesive sheet is adhered to the semiconductor wafer by separating the protective film on the side facing the semiconductor wafer.

5. The manufacturing method of semiconductor wafer of claim 4, further comprising a separating step for separating the other protective film after the first adhering step.

6. The manufacturing method of semiconductor wafer of claim 1, wherein
    the lid part has a plane size smaller than a plane size of each semiconductor device so as to adhere the lid part to the adhesive layer of each semiconductor element.

7. The manufacturing method of semiconductor wafer of claim 1, wherein
    the lid part has a plane size capable of covering a plurality of semiconductor devices so as to adhere the lid part to the adhesive layer of a plurality of semiconductor elements collectively.

8. The manufacturing method of semiconductor wafer of claim 1, wherein
    micro-lenses are formed on the semiconductor wafer in which a plurality of semiconductor elements are formed.

9. A manufacturing method of semiconductor device comprising a dividing step for cutting and dividing a semiconductor wafer manufactured by the manufacturing method of claim 1 into individual semiconductor devices having a lid part.

10. A manufacturing method of semiconductor wafer having a lid part, comprising:
    an adhesive layer forming step for forming an adhesive layer containing a photo-curing adhesive and a thermosetting adhesive on a semiconductor wafer in which a plurality of semiconductor elements are formed;

a first adhering step for adhering the adhesive layer and the semiconductor wafer together by selectively exposing the adhesive layer to light and curing the photo-curing adhesive contained in the adhesive layer on a peripheral portion of each semiconductor element;

a development step for patterning the adhesive layer by developing the adhesive layer and removing the adhesive layer in an area where the photo-curing adhesive has not cured;

an inspection step for inspecting each semiconductor element to determine whether the patterned adhesive layer is satisfactory or not;

a repairing step for repairing the adhesive layer having a defective portion and determined to be unsatisfactory in the inspection step with an adhesive containing a thermosetting adhesive;

a lid part placing step for placing a lid part on the adhesive layer of the semiconductor element determined to be satisfactory in the inspection step and on the adhesive layer repaired in the repairing step; and a second adhering step for adhering the adhesive layer and the lid part together by heating the adhesive layer and causing the thermosetting adhesive contained in the adhesive layer to exhibit adhesive properties.

11. The manufacturing method of semiconductor wafer of claim 10, wherein in the adhesive layer forming step, the adhesive layer is formed on the semiconductor wafer by adhering an adhesive sheet containing a photo-curing adhesive and a thermosetting adhesive to the semiconductor wafer in which a plurality of semiconductor elements are formed.

12. The manufacturing method of semiconductor wafer of claim 11, wherein protective films are attached to both sides of the adhesive sheet, and in the adhesive layer forming step, the adhesive sheet is adhered to the semiconductor wafer by separating the protective film on the side facing the semiconductor wafer.

13. The manufacturing method of semiconductor wafer of claim 12, further comprising a separating step for separating the other protective film after the first adhering step.

14. The manufacturing method of semiconductor wafer of claim 10, wherein the lid part has a plane size smaller than a plane size of each semiconductor device so as to adhere the lid part to the adhesive layer of each semiconductor element.

15. The manufacturing method of semiconductor wafer of claim 10, wherein the lid part has a plane size capable of covering a plurality of semiconductor devices so as to adhere the lid part to the adhesive layer of a plurality of semiconductor elements collectively.

16. The manufacturing method of semiconductor wafer of claim 10, wherein micro-lenses are formed on the semiconductor wafer in which a plurality of semiconductor elements are formed.

17. A manufacturing method of semiconductor device comprising a dividing step for cutting and dividing a semiconductor wafer manufactured by the manufacturing method of claim 10 into individual semiconductor devices having a lid part.

* * * * *